(12) United States Patent
Su et al.

(10) Patent No.: US 11,694,950 B2
(45) Date of Patent: Jul. 4, 2023

(54) SEMICONDUCTOR PACKAGE

(71) Applicant: Powertech Technology Inc., Hukou Township (TW)

(72) Inventors: Chih-Yen Su, Hukou Township (TW); Chun-Te Lin, Hukou Township (TW)

(73) Assignee: Powertech Technology Inc., Hukou Township (TW)

( * ) Notice: Subject to any disclaimer, the term of this patent is extended or adjusted under 35 U.S.C. 154(b) by 0 days.

(21) Appl. No.: 17/198,653

(22) Filed: Mar. 11, 2021

(65) Prior Publication Data

US 2022/0148955 A1 May 12, 2022

(30) Foreign Application Priority Data

Nov. 12, 2020 (TW) ................................. 109139600

(51) Int. Cl.
*H01L 23/498* (2006.01)
*H01L 23/31* (2006.01)
*H01L 23/00* (2006.01)

(52) U.S. Cl.
CPC .... *H01L 23/49838* (2013.01); *H01L 23/3128* (2013.01); *H01L 23/49866* (2013.01); *H01L 24/08* (2013.01); *H01L 24/32* (2013.01); *H01L 2224/08165* (2013.01); *H01L 2224/32225* (2013.01)

(58) Field of Classification Search
CPC ........... H01L 23/49838; H01L 23/3128; H01L 23/49866; H01L 24/08; H01L 24/32; H01L 2224/08165; H01L 2224/32225; H01L 2224/04042; H01L 2224/04105; H01L 2224/12105
See application file for complete search history.

(56) References Cited

U.S. PATENT DOCUMENTS

| | | | | |
|---|---|---|---|---|
| 2013/0137217 | A1* | 5/2013 | Kindo | H01L 21/50 438/109 |
| 2014/0021625 | A1* | 1/2014 | Nakamura | H01L 25/105 257/773 |
| 2017/0271267 | A1* | 9/2017 | Yen | H01L 24/06 |

FOREIGN PATENT DOCUMENTS

| | | | | |
|---|---|---|---|---|
| CN | 108962764 A | | 12/2018 | |
| JP | 2014063881 A | * | 4/2014 | ... H01L 2224/73204 |
| TW | 201631673 A | | 9/2016 | |

* cited by examiner

*Primary Examiner* — Jasmine J Clark
(74) *Attorney, Agent, or Firm* — PATENTTM.US

(57) ABSTRACT

A semiconductor package has a substrate, a chip and an encapsulation. The substrate has a dielectric layer, a copper wiring layer and a solder resist layer formed thereon. The copper wiring layer is formed on the dielectric layer and is covered by the solder resist layer. The solder resist layer has a chip area defined thereon and an annular opening formed thereon. The annular opening surrounds the chip area and exposes part of the copper wiring layer. The chip is mounted on the chip area and is encapsulated by the encapsulation. Therefore, the semiconductor package with the annular opening makes the solder resist layer discontinuous, and the concentration stress is decreased to avoid a crack formed on the solder resist layer or the copper wiring layer when doing thermal-cycle test.

20 Claims, 6 Drawing Sheets

US 11,694,950 B2

1

SEMICONDUCTOR PACKAGE

CROSS-REFERENCE TO RELATED APPLICATIONS

This application is based upon and claims priority under 35 U.S.C. 119 from Taiwan Patent Application No. 109139600 filed on Nov. 12, 2020, which is hereby specifically incorporated herein by this reference thereto.

BACKGROUND OF THE INVENTION

1. Field of the Invention

The present invention is related to a semiconductor package, and more particularly to a semiconductor package with lower stress concentration.

2. Description of the Prior Arts

A thermal-cycle test (TCT) is a common test of reliability of a semiconductor package. The temperature of TCT changed a lot to simulate terrible environments, so the potential problems and reason of failure may be found by suffering from such large temperature changes at TCT.

With reference to FIG. 4A, a semiconductor package 70 in accordance with the prior art has a substrate 71, a chip 72 and an encapsulation 73. The semiconductor package is tested by TCT many times, after that a crack 712 formed on a solder resist layer 711 of the substrate 71 which near an edge of the chip 72. With reference to FIG. 4B, the crack 712 may further extend to a copper wiring layer 713 of the substrate 71, so the reliability of the semiconductor package 70 is reduced. Further, if the crack 712 extends to the copper wiring layer 713, a pad 721 of the chip 72 would become short with the copper wiring layer 713 to cause the failure.

The reason why the crack 712 is formed is because of the encapsulation 73 and the substrate 71 having different coefficient of thermal expansion (CTE), the deformation of the encapsulation 73 is larger than the substrate 71 when the temperature changes. The chip 72 is difficult to be deformed either. Therefore, the crack 712 is caused since the deformation of the encapsulation 73 is concentrated at the edge of the chip 72.

To overcome the shortcomings, the present invention provides a semiconductor package to mitigate or to obviate the aforementioned problems.

SUMMARY OF THE INVENTION

An objective of the present invention is to provide a semiconductor package to obviate the aforementioned problems.

To achieve the objective as mentioned above, the semiconductor package comprising:
  a substrate having
    a dielectric layer having a first surface;
    a copper wiring layer formed on the first surface of the dielectric layer;
    a solder resist layer covering the copper wiring layer and having
      a chip area;
      an external area surrounding the chip area; and
      an annular opening formed on the external area, wherein a part of the copper wiring layer is exposed in the annular opening;

2 a first chip mounted on the chip area of the solder resist layer and electrically connected to the substrate; and
  an encapsulation formed on the chip area and the external area of the substrate to encapsulate the first chip.

From the above description, the semiconductor package has the annular opening to make the solder resist layer discontinuous. Therefore, the concentration stress is decreased to avoid a crack formed on the solder resist layer or the copper wiring layer when thermal-cycle test.

Other objectives, advantages and novel features of the invention will become more apparent from the following detailed description when taken in conjunction with the accompanying drawings.

DETAILED DESCRIPTION OF THE EMBODIMENTS

The present invention is related to a semiconductor package. With embodiments and drawings thereof, the features of the present invention are described in detail as fallow.

Figure 1A:
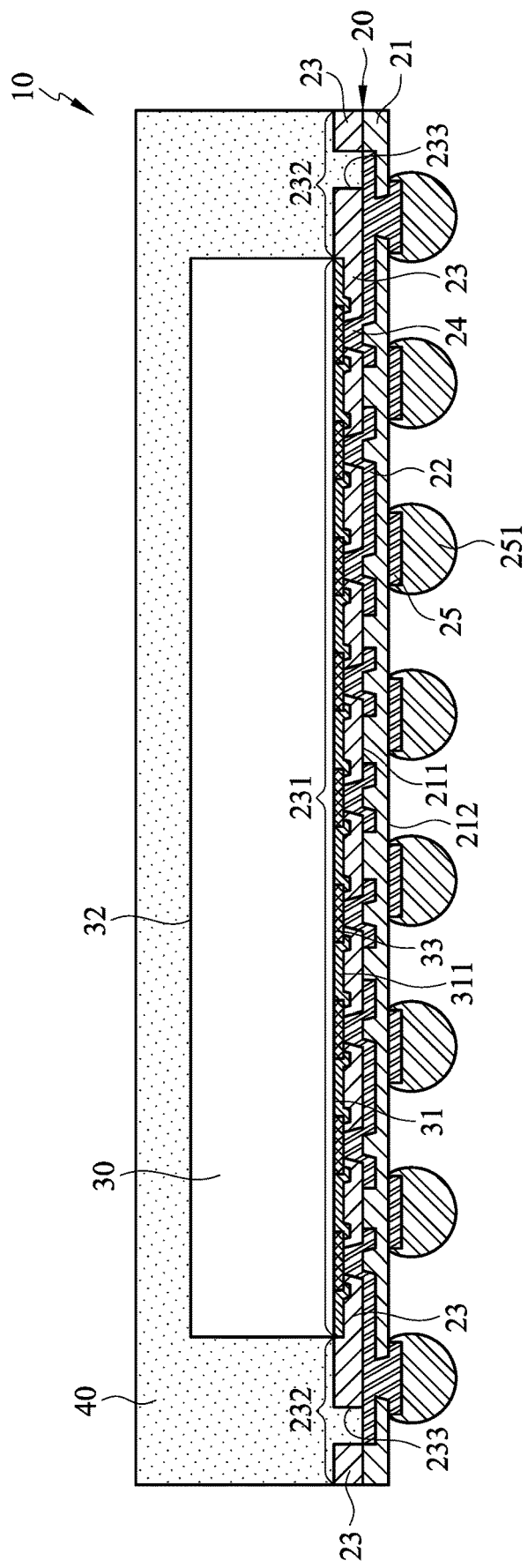
FIG. 1A is a schematic cross sectional view of a first embodiment of a semiconductor package in accordance with the present invention.

With reference to FIG. 1A, a first embodiment of a semiconductor package 10 in accordance with the present invention has a substrate 20, a first chip 30 and an encapsulation 40. The first chip 30 is mounted on the substrate 20 and is electrically connected to the substrate 20. The first chip 30 is encapsulated by the encapsulation 40. In this embodiment, the semiconductor package 10 is a flip-chip package structure.

The substrate 20 has a dielectric layer 21, a copper wiring layer 22, a solder resist layer 23, a plurality of internal pads 24 and a plurality of external pads 25. In this embodiment, the dielectric layer 21 has a first surface 211 and a second surface 212 opposite to each other. The copper wiring layer 22 and the internal pads 24 are formed on the first surface 211. The internal pads 24 are electrically connected respectively to the copper wiring layer 22. The solder resist layer 23 is formed on the first surface 211 to cover the copper wiring layer 22, but does not cover the internal pads 24. Thus, each of the internal pads 24 is exposed on the solder resist layer 23. With reference to FIG. 1A, the solder resist layer 23 has a chip area 231 and an external area 232. The internal pads 24 are exposed on the chip area 231 of the solder resist layer 23. The external area 232 surrounds the chip area 231 and has an annular opening 233 formed thereon. A part of the copper wiring layer 22 is exposed in the annular opening 233. The external pads 25 are formed on the second surface 212 and are electrically connected respectively to the copper wiring layer 22. Each of the external pads 25 has a solder ball 251 formed thereon. In one embodiment, the annular opening 233 may be closer to the chip area 231 of the solder resist layer 23.

Figure 2B:
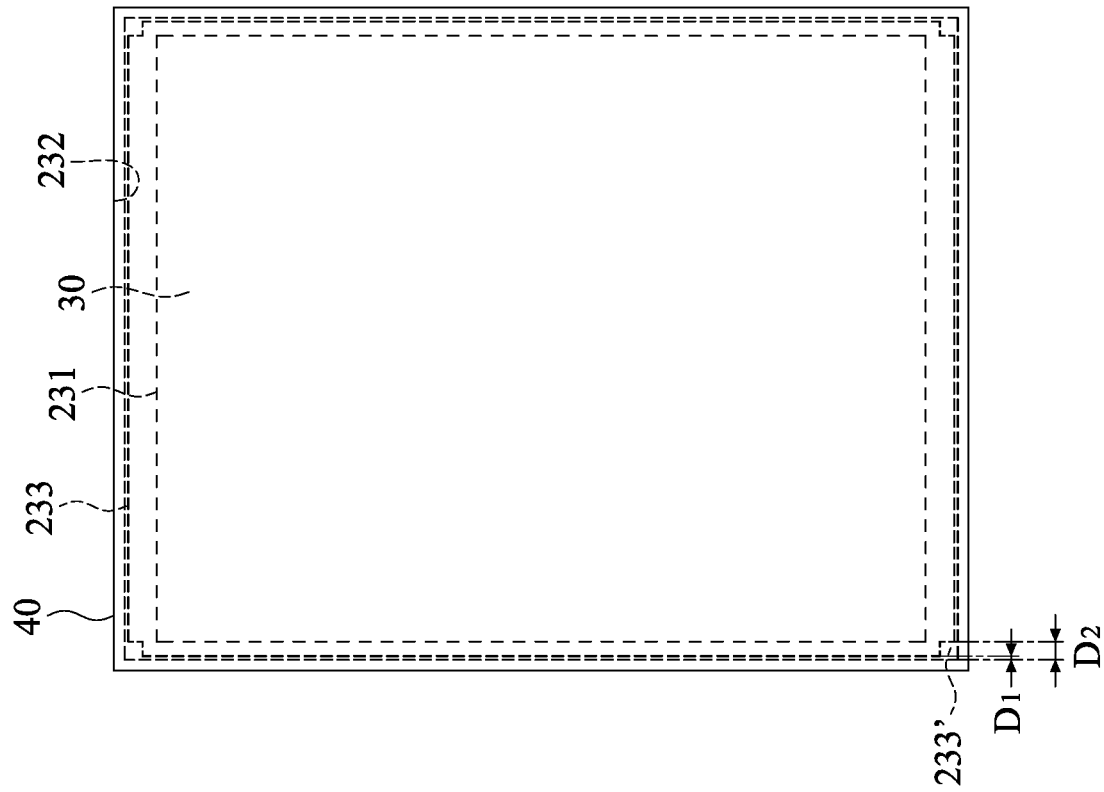
FIG. 2B is a top view of a third embodiment of a semiconductor package in accordance with the present invention.
Figure 2A:
FIG. 2A is a top view of the semiconductor package in FIG. 1A.

With reference to FIG. 2A, the solder resist layer has a width D1. In another embodiment as shown in FIG. 2B, the annular opening 233 has a plurality of corner openings 233'. The corner openings 233' are formed on the external area 232, respectively communicate with the annular opening 233, and respectively corresponds to a plurality of corners of the chip area 231 of the solder resist layer 23. The part of the annular opening 233 communicating with the corner opening 233' has a width D2 larger than the width D1. Therefore, the corner openings 233' enlarge the parts of the annular opening 233 corresponding to the corners of the chip area 231. In one embodiment, the widths D1, D2 are between 50 um to 300 um.

The first chip 30 has a first active surface 31 and a first backside surface 32 opposite to each other. In this embodiment, the first active surface 31 of the first chip 30 is mounted on the chip area 231 of the solder resist layer 23. With reference to FIG. 1A, the first active surface 31 has a plurality of first pads 33 formed thereon. The first pads 33 are electrically connected respectively to the internal pads 24. Thus, a gap is formed between the first active surface 31 and the solder resist layer 23 for filling an underfill 311 to protect the first pads 33 and the internal pads 24.

The encapsulation 40 is formed on the substrate 20 to encapsulate the first chip 30. With reference to FIG. 1A, the encapsulation 40 is formed on the first chip 30 and the external area 232 of the solder resist layer 23 to align four sides of the encapsulation 40 with four sides of the substrate 20. In this embodiment, the annular opening 233 is filled with the encapsulation 40.

Figure 1B:
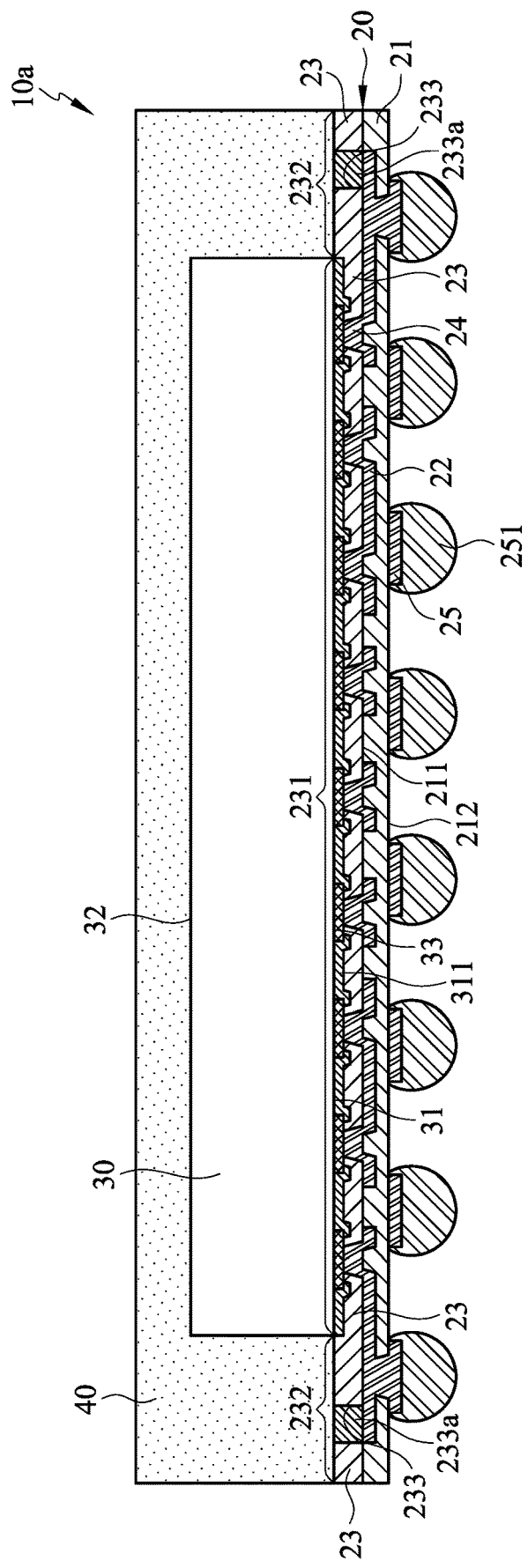
FIG. 1B is a schematic cross sectional view of a second embodiment of a semiconductor package in accordance with the present invention.

With reference to FIG. 1B, a second embodiment of a semiconductor package 10a in accordance with the present invention has similar structure with semiconductor package 10 as shown in FIG. 1A, but the annual opening 233 is filled with a filling material 233a. In this embodiment, the Young's modulus of the filling material 233a is larger than the encapsulation 40. In one embodiment, the Young's modulus of the underfill 311 is larger than the encapsulation 40. When the gap between the first active surface 31 and the solder resist layer 23 is filled with the underfill 311, the annual opening 233 is also filled with the underfill 311 simultaneously. Thus, the underfill 311 is used as the filling material 233a. In another embodiment, the annual opening 233 is filled with an epoxy molding compound as the filling material 233a.

Figure 3:
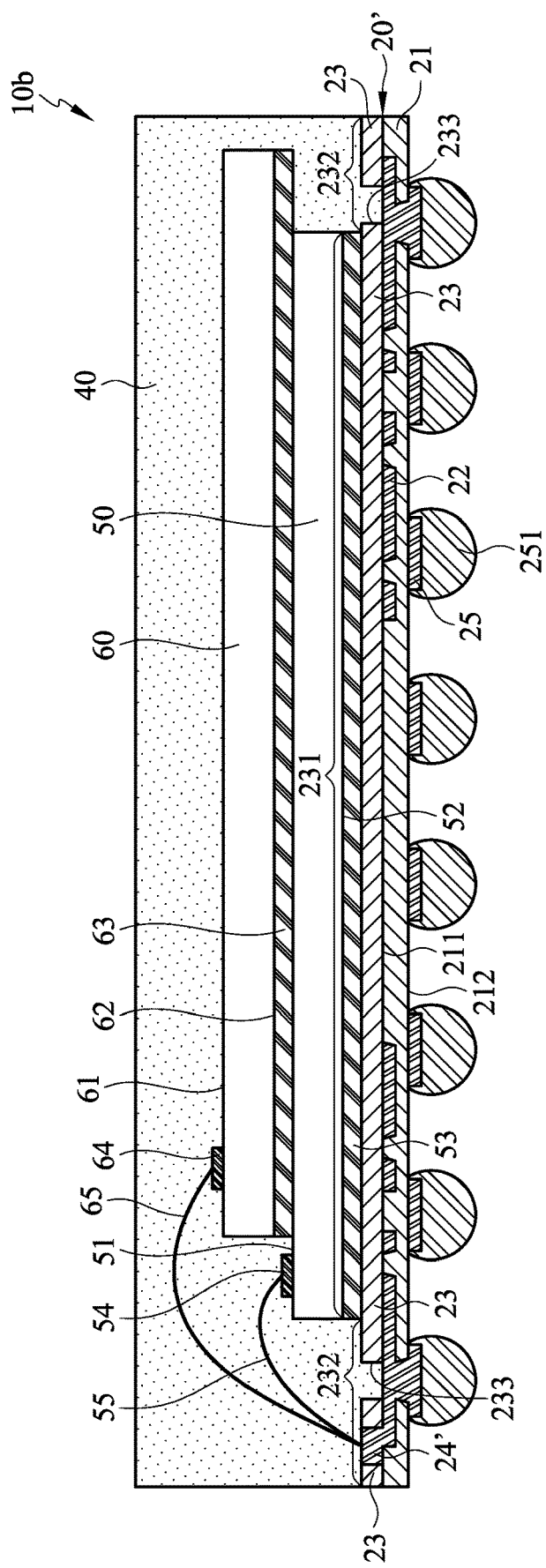
FIG. 3 is a schematic cross sectional view of a fourth embodiment of a semiconductor package in accordance with the present invention.
Figure 4A:
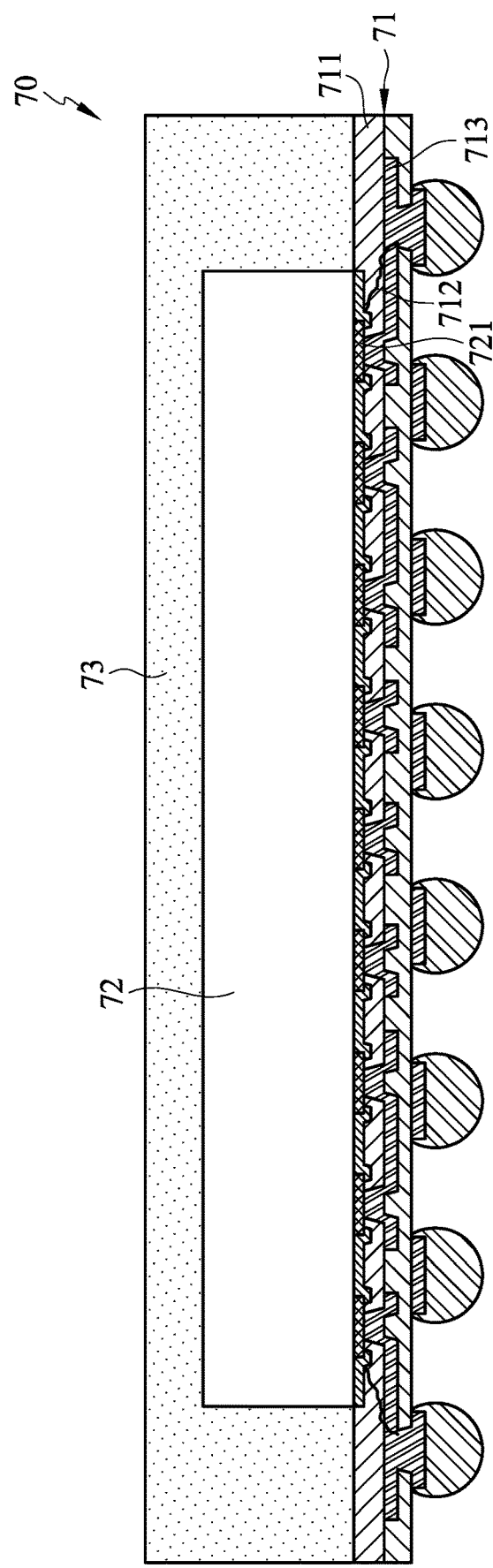
FIG. 4A is a schematic cross sectional view of a conventional semiconductor package in accordance with the prior art.
Figure 4B:
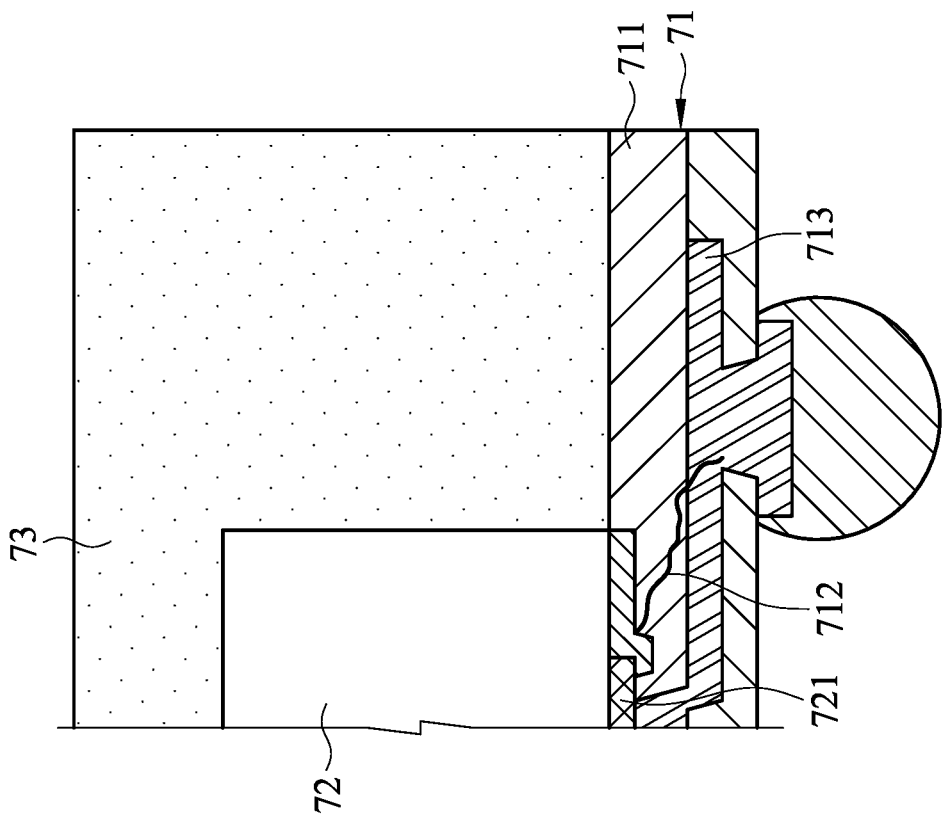
FIG. 4B is a partial enlargement view of the conventional semiconductor package in FIG. 4A.

With reference to FIG. 3, a fourth embodiment of a semiconductor package 10b in accordance with the present invention has similar structure with the semiconductor 10 as shown in FIG. 1A, and also comprises the substrate 20', the first chip 50 and the encapsulation 40. However, the semiconductor 10b is a wire bonding package structure.

The substrate 20' has multiple internal pads 24' formed on the external area 232 of the solder resist layer 23. In this embodiment, the annual opening 233 is closer to the chip area 231 than the internal pads 24'. With reference to FIG. 2A, the annular opening 233 has a width D1. In another embodiment, with reference to FIG. 2B, the corner opening 233' has a width D2 larger than the width D1. In one embodiment, the widths D1, D2 are between 50 um to 300 um.

The first chip 50 has a first active surface 51 and a first backside surface 52 opposite to each other. In this embodiment, the first backside 52 of the first chip 50 is mounted on the chip area 231 of the solder resist layer 23 by a first adhesive layer 53. The first active surface 51 has a plurality of first pads 54 formed thereon. The first pads 54 are electrically connected respectively to the internal pads 24' by a first wire 55. In another embodiment, the semiconductor package 10b further has a second chip 60. The second chip 60 has a second active surface 61 and a second backside surface 62 opposite to each other. In this embodiment, the second backside surface 62 is mounted on the first active surface 51 by a second adhesive layer 63, but does not cover the first pads 54. The second active surface 61 has a plurality of second pads 64 formed thereon. The second pads 64 are electrically connected respectively to the internal pads 24' by a second wire 65. Therefore, the semiconductor package as described may have multiple chips, not limited to two chips.

The encapsulation 40 is formed on the substrate 20' to encapsulate the first chip 50 and the second chip 60. In one embodiment, the annular opening 233 is filled with the encapsulation 40. In another embodiment as shown in FIG. 1B, the annular opening 233 is filled with the filling material 233a, which has larger Young's modulus than the encapsulation 40. In this embodiment, the filling material 233a may be an underfill or an epoxy molding compound.

In conclusion, the solder resist layer has the annular opening formed on the external area to make the solder resist layer discontinuous. Therefore, the concentration stress is decreased to avoid a crack formed on the solder resist layer or the copper wiring layer. Furthermore, the corner opening may have larger width to more effectively decrease the concentration stress. The annular opening may be filled with the filling material to resist the stress by the deformation of the encapsulation, so the semiconductor package may avoid the cracks of the substrate around the chip.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A semiconductor package comprising:
   a substrate having
      a dielectric layer having a first surface;
      a copper wiring layer formed on the first surface of the dielectric layer;
      a solder resist layer covering the copper wiring layer and having
         a chip area;
         an external area surrounding the chip area; and
         an annular opening formed on the external area, wherein a part of the copper wiring layer is exposed in the annular opening;
   a first chip mounted on the chip area of the solder resist layer and electrically connected to the substrate; and
   an encapsulation formed on the first chip and the external area of the substrate to encapsulate the first chip.

2. The semiconductor package as claimed in claim 1, wherein
   the substrate further has
      a plurality of internal pads formed on the first surface of the dielectric layer, electrically connected respectively to the copper wiring layer and exposed on the chip area of the solder resist layer; and a plurality of external pads formed on the second surface of the dielectric layer and electrically connected respectively to the copper wiring layer; and the first chip further has a first active surface facing to the substrate; and a plurality of first pads formed on the first active surface and electrically connected respectively to the internal pads.

3. The semiconductor package as claimed in claim 2, wherein a gap between the first active surface and the solder resist layer is filled with an underfill.

4. The semiconductor package as claimed in claim 1, wherein the substrate further has a plurality of internal pads formed on the first surface of the dielectric layer and placed outside the annular opening, the plurality of internal pads being electrically connected respectively to individual wires in the copper wiring layer and exposed on the external area of the solder resist layer; and a plurality of external pads formed on the second surface of the dielectric layer and electrically connected respectively to the copper wiring layer; and the first chip further has a first active surface;

a plurality of first pads formed on the first active surface and electrically connected respectively to the internal pads by wire bond method; and a first backside surface opposite to the first active surface, facing to the substrate and mounted on the chip area of the solder resist layer.

5. The semiconductor package as claimed in claim 4, wherein a second chip is further mounted on the first chip and has a second active surface away from the first chip and has a plurality of second pads formed on the second active surface and electrically connected respectively to the internal pads by wire bond method; and a second backside surface opposite to the second active surface.

6. The semiconductor package as claimed in claim 1, wherein the annular opening is further filled with the encapsulation or a filling material, wherein the Young's modulus of the filling material is larger than the encapsulation.

7. The semiconductor package as claimed in claim 6, wherein the filling material is an epoxy molding compound or an underfill.

8. The semiconductor package as claimed in claim 1, wherein the solder resist layer further has a plurality of corner openings formed on the external area, respectively corresponding to a plurality of corners of the chip area, and abutting the annular opening.

9. The semiconductor package as claimed in claim 2, wherein the solder resist layer further has a plurality of corner openings formed on the external area, respectively corresponding to a plurality of corners of the chip area, and abutting the annular opening.

10. The semiconductor package as claimed in claim 3, wherein the solder resist layer further has a plurality of corner openings formed on the external area, respectively corresponding to a plurality of corners of the chip area, and abutting the annular opening.

11. The semiconductor package as claimed in claim 4, wherein the solder resist layer further has a plurality of corner openings formed on the external area, respectively corresponding to a plurality of corners of the chip area, and abutting the annular opening.

12. The semiconductor package as claimed in claim 5, wherein the solder resist layer further has a plurality of corner openings formed on the external area, respectively corresponding to a plurality of corners of the chip area, and abutting the annular opening.

13. The semiconductor package as claimed in claim 8, wherein the annular opening is further filled with the encapsulation or a filling material, wherein the Young's modulus of the filling material is larger than the encapsulation.

14. The semiconductor package as claimed in claim 9, wherein the annular opening is further filled with the encapsulation or a filling material, wherein the Young's modulus of the filling material is larger than the encapsulation.

15. The semiconductor package as claimed in claim 10, wherein the annular opening is further filled with the encapsulation or a filling material, wherein the Young's modulus of the filling material is larger than the encapsulation.

16. The semiconductor package as claimed in claim 11, wherein the annular opening is further filled with the encapsulation or a filling material, wherein the Young's modulus of the filling material is larger than the encapsulation.

17. The semiconductor package as claimed in claim 12, wherein the annular opening is further filled with the encapsulation or a filling material, wherein the Young's modulus of the filling material is larger than the encapsulation.

18. The semiconductor package as claim in claim 13, wherein the filling material is an epoxy molding compound or an underfill.

19. The semiconductor package as claim in claim 14, wherein the filling material is an epoxy molding compound or an underfill.

20. The semiconductor package as claim in claim 15, wherein the filling material is an epoxy molding compound or an underfill.

\* \* \* \* \*